US006788144B2

(12) United States Patent
Honda

(10) Patent No.: US 6,788,144 B2
(45) Date of Patent: Sep. 7, 2004

(54) VARIABLE-GAIN AMPLIFIER

(75) Inventor: Hiroki Honda, Hayami-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/277,257

(22) Filed: Oct. 22, 2002

(65) Prior Publication Data

US 2003/0076170 A1 Apr. 24, 2003

(30) Foreign Application Priority Data

Oct. 23, 2001 (JP) ........................................ 2001-325081

(51) Int. Cl.[7] ............................................... H03F 3/45
(52) U.S. Cl. ...................................................... 330/254
(58) Field of Search ................................ 330/252, 254; 327/356, 359

(56) References Cited

U.S. PATENT DOCUMENTS 4,560,947 A * 12/1985 Frey ............................ 330/254

* cited by examiner

Primary Examiner—Steven J. Mottola
(74) Attorney, Agent, or Firm—William B. Kempler; W. James Brady, III; Frederick J. Telecky, Jr.

(57) ABSTRACT

A variable-gain amplifier that prevents the change in the in-phase voltage of the output occurring when the gain is changed and improves the frequency characteristic compared with the conventional method. The differential current of currents I13 and I13' changes corresponding to input signal S1. As a result, the differential current of currents I11 and I12 also change correspondingly, and the differential voltage v13 between nodes N1 and N2 varies. The gain of differential voltage v13 with respect to input signal S1 is variable corresponding to the current conversion gains of current converters 2 and 3. When the current conversion gains vary corresponding to the input signal S2, the voltages at nodes N1' and N2' are adjusted such that the voltages at nodes N1 and N2 are constant with respect to the change in gain. Since voltage-adjustment circuit 1 adjusts the voltages at nodes N1 and N2 via resistors R11 and R12, the deterioration in the frequency characteristic caused by the output capacitance of voltage-adjustment circuit 4 can be mitigated.

5 Claims, 4 Drawing Sheets

VARIABLE-GAIN AMPLIFIER

FIELD OF THE INVENTION

The present invention pertains to a variable-gain amplifier in which the gain is changed in accordance with the input signal.

BACKGROUND OF THE INVENTION

FIG. 5 is a schematic circuit diagram illustrating an example of a conventional variable-gain amplifier.

In FIG. 5, Q1–Q6 represent npn transistors; R1–R3 represent resistors; SC1 and SC2 represent constant current sinks; T1–T3 and T1'-T3' represent terminals.

The base of npn transistor Q1 is connected to terminal T1, and its emitter is connected to reference potential GND via constant current sink SC1.

The base of npn transistor Q2 is connected to terminal T1', and its emitter is connected to reference potential GND via constant current sink SC2.

Resistor R3 is connected between the emitters of npn transistor Q1 and npn transistor Q2.

The emitters of npn transistor Q3 and npn transistor Q4 are connected together and to the collector of npn transistor Q1. Also, the base of npn transistor Q3 and the base of npn transistor Q4 are connected to terminals T2 and T2', respectively.

The emitters of npn transistor Q5 and npn transistor Q6 are connected together and to the collector of npn transistor Q2. Also, the base of npn terminal Q5 and the base of npn transistor Q6 are connected to terminals T2' and T2, respectively.

The collector of npn transistor Q3 is connected to power supply Vcc via resistor R1 and to terminal T3.

The collector of npn transistor Q6 is connected to power supply Vcc via resistor R2 and to terminal T3'.

The collectors of npn transistor Q4 and npn transistor Q5 are directly connected to power supply Vcc.

When the variable-gain amplifier shown in FIG. 5 with the configuration is used, the differential voltage v1 input between terminals T1 and T1' is amplified by the gain G1 and output as differential voltage v3 that appears between terminals T3 and T3'. The gain G1 can vary corresponding to the differential voltage v2 input between terminals T2 and T2'.

First, the relationship between gain G1 and differential voltage v2 will be explained.

When the differential amplifier comprised of the transistor pair of npn transistor Q3 and npn transistor Q4 operates outside the saturation region, current I1 flowing through resistor R1 can be approximated by the following equation.

$$I1 = I3/\{1 + \exp(-v2/VT)\} \quad (1)$$
$$= I3 \times A(v2)$$

where $$VT = kT/q \quad (2)$$

$$A(v2) = 1/\{1 + \exp(-v2/VT)\} \quad (3)$$

VT in Equation (1) represents the thermal voltage of the transistor. It is expressed as shown in Equation (2) using Boltzmann's constant k, the junction temperature T of the transistor, and the charge q on the electron.

Current I2 flowing through resistor R2 can be approximated using the following equation similar to Equation (1).

$$I2 = I3' \times A(v2) \quad (4)$$

Also, when equal currents Isc flow in constant current sinks SC1 and SC2, the collector current I3 of npn transistor Q1 and the collector current I3' of npn transistor Q2 can be approximated using the following equations.

$$I3 = Isc + Ie \quad (5)$$

$$I3' = Isc - Ie \quad (6)$$

where Ie represents the current flowing through resistor R3.

Also, differential voltage v1 is expressed as follows using the base-emitter voltage Vbe1 of npn transistor Q1, base-emitter voltage Vbe2 of npn transistor Q2, and resistance r3 of resistor R3.

$$V1 = Vbe1 - r3 \times Ie - Vbe2 \quad (7)$$

When resistors R1 and R2 have the same resistance r1, the differential voltage v3 is expressed as follows.

$$V3 = (I2 - I1) \times r1 \quad (8)$$

In this case, differential voltage v1 varies by as much as Δv1. If the voltage change of base-emitter voltage Vbe1 and base-emitter voltage Vbe2 is small compared with voltage Δv1, voltage Δv1 can be expressed as follows.

$$\Delta v1 = r3 \times \Delta Ie \quad (9)$$

ΔIe represents the change in current Ie corresponding to the change in voltage Δv1.

Also, the change ΔI3 in current I3 and the change ΔI3' in current I3' are expressed by the following equations.

$$\Delta I3 = \Delta Ie \quad (10)$$
$$= \Delta v1/r3$$

$$\Delta I3' = \Delta Ie \quad (11)$$
$$= -\Delta v1/r3$$

Based on Equations (10) and (11), the change ΔI1 in current I1 and the change ΔI2 in current I2 can be expressed as follows.

$$\Delta I1 = \Delta I3 \times A(v2) \quad (12)$$
$$= \Delta v1 \times A(v2)/r3$$

$$\Delta I2 = \Delta I3' \times A(v2) \quad (13)$$
$$= -\Delta v1 \times A(v2)/r3$$

Based on Equations (8), (12), and (13), the change Δv3 of differential voltage v3 can be expressed as follows.

$$\Delta v3 = (\Delta I2 - \Delta I1) \times r1 \quad (14)$$
$$= -2\Delta v1 \times A(v2) \times r1/r3$$
$$= G1 \times \Delta v1$$

where $$G1 = -2A(v2) \times r1/r3 \quad (15)$$

Consequently, as shown in Equation 15, the gain G1 of variable-gain amplifier 10 shown in FIG. 5 can be changed corresponding to differential voltage v2.

The voltage drop Vt3 at terminal T3 with respect to power supply Vcc and the voltage drop Vt3' at terminal T3' with respect to power supply Vcc are expressed as followed on the basis of the equation.

$$Vt3 = r1 \times I1 \qquad (16)$$
$$= Isc \times r1 \times A(v2) + Ie \times r1 \times A(v2)$$

$$Vt3' = r1 \times I2 \qquad (17)$$
$$= Isc \times r1 \times A(v2) - Ie \times r1 \times A(v2)$$

In Equations (16) and (17), the second term represents a signal component that includes current Ie, which varies corresponding to the change in differential voltage v1, and the first term represents a certain in-phase component independent of the change in differential voltage v1. Also, the in-phase component varies corresponding to differential voltage v2. Consequently, when differential voltage v2 is changed in order to change the gain of the variable-gain amplifier, the in-phase voltage of the output also changes correspondingly. Since there is a limit on the range of the allowable in-phase voltage in the next stage of circuit that receives differential voltage v3, it is necessary to limit the dynamic range of differential voltage v3 or gain G1 to keep the in-phase voltage within that range.

The circuit shown in FIG. 6 is used to solve this problem of variable-gain amplifier 10 shown in FIG. 5.

The same symbols in FIGS. 5 and 6 represent the same respective elements. Also, in FIG. 6, Q7–Q10 represent npn transistors, and SC3 represents a constant current sink.

The emitters of npn transistors Q7–Q10 are connected to each other and to reference potential GND via constant current sink SC3.

Also, the bases of npn transistor Q7 and npn transistor Q8 are connected to terminal T2, and the collectors are connected to power supply Vcc.

The base of npn transistor Q9 is connected to terminal T2', and the collector is connected to the collector of npn transistor Q3.

The base of npn transistor Q10 is connected to terminal T2', and the collector is connected to the collector of npn transistor Q6.

In the variable-gain amplifier 11 shown in FIG. 6, when the same current Isc as that flowing in constant current sinks SC1 And SC2 flows in constant current sink SC3, the collector current I4 of npn transistor Q9 and the collector current I5 of npn transistor Q10 can be expressed as follows.

$$I4 = I5 = Isc \times A'(v2) \qquad (18)$$

where $$A'(v2) = 1/\{1 + \exp(v2/VT)\} \qquad (19)$$

Also, differential voltage v3 is expressed as follows.

$$V3 = (I2 + I5 - I1 - I4) \times r1 \qquad (20)$$

Since currents I4 and I5 are constant and independent of differential voltage v1, the change Δv3 in differential voltage v3 with respect to the change Δv1 in differential voltage v1 is the same as that expressed by Equation (14), and gain G1 will be the same as is expressed by Equation (15). Consequently, in the variable-gain amplifier 11 shown in FIG. 6, gain G1 can also be changed corresponding to differential voltage v2 in the same way as shown in FIG. 5.

Also, the voltage drop Vt3 at terminal T3 with respect to power supply Vcc and the voltage drop Vt3' at terminal T3 with respect to power supply Vcc are expressed as follows.

$$Vt3 = r1 \times (I1 + I4) \qquad (21)$$
$$= Isc \times r1 \times \{A(v2) + A'(v2)\} + Ie \times r1 \times A(v2)$$
$$= Isc \times r1 + Ie \times r1 \times A(v2)$$

$$Vt3' = r1 \times (I2 + I5) \qquad (22)$$
$$= Isc \times r1 \times \{A(v2) + A'(v2)\} - Ie \times r1 \times A(v2)$$
$$= Isc \times r1 - Ie \times r1 \times A(v2)$$

In Equations (21) and (22), the second term represents a signal component that varies corresponding to the change in differential voltage v1, and the first term represents a certain in-phase component that is independent of the change in differential voltage v1. The in-phase component, unlike Equations (16) and (17), also does not change with differential voltage v2. Consequently, the in-phase voltage of the output independent of gain G1 is constant. In this way, the problem of the variable-gain amplifier 10 shown in FIG. 5 is solved.

In the variable-gain amplifier 11 shown in FIG. 6, however, since not only the collector capacitance of npn transistor Q3 and npn transistor Q6 but also the collector capacitance of npn transistor Q9 and npn transistor Q10 are added to the output terminal of differential voltage v3, the frequency characteristic deteriorates compared with the variable-gain amplifier 10 shown in FIG. 5.

A general object of the present invention is to provide a variable-gain amplifier that can prevent the change in the in-phase voltage of the output occurring when the gain is changed and improve the frequency characteristic compared with the conventional method.

SUMMARY OF THE INVENTION

This and other objects and features are provided, in accordance with one aspect of the present invention by a variable-gain amplifier having the following: a differential current output circuit that outputs a first current and a second current as differential currents corresponding to a first input signal, a first current converter that converts the first current to a third current at a current conversion rate corresponding to a second input signal and outputs the third current to a first node, a second current converter that converts the second current to a fourth current at a current conversion rate corresponding to the second input signal and outputs the fourth current to a second node, a first load resistor connected between the first node and a third node, a second load resistor connected between the second and third nodes, and a voltage-adjustment circuit, which has an adjustable resistor between the voltage supply terminal and the third node and outputs a current corresponding to the second input signal to the third node such that the voltages at the first and second nodes do not change as the second signal varies.

In an aspect of the variable-gain amplifier of the present invention, the differential current of the first and second currents varies corresponding to the first input signal. As a result, the differential current of the third and fourth currents also changes. The voltage drops caused by the first and second load resistors change, and thus the differential voltage between the first and second nodes changes. The gain of the differential voltage with respect to the first input signal changes corresponding to the current conversion rates (current conversion gains) of the first and second current converters. When the current conversion gain changes corresponding to the second input signal, the current supplied to the third node is controlled corresponding to the second input signal such that the voltages at the first and second nodes become constant with respect to this change in the voltage-adjustment circuit. Consequently, when the gain of the differential voltage is changed with respect to the first input signal, the changes in the voltages at the first and second nodes are restricted. Also, since the voltage-adjustment circuit adjusts the voltages at the first and second nodes via the first and second load resistors, the deterioration of the frequency characteristic caused by the output capacitance of the voltage-adjustment circuit is alleviated.

In an aspect of the present invention the voltage-adjustment circuit may also have a pair of differential transistors to which the second input signal is supplied as a differential signal, and one of the transistors supplies a current corresponding to the second input signal to the third node.

In an aspect of the present invention, the first current converter may also have a pair of differential transistors to which the second input signal is supplied as a differential signal. One of the transistors supplies the third current to the first node. The second current converter may also have a pair of differential transistors to which the second input signal is supplied as a differential signal. One of the transistors supplies the fourth current to the second node.

In an aspect of the present invention, the differential current output circuit may also have a pair of differential transistors, to which the first input signal is supplied as a differential signal, and a resistor connected between the differential transistors. The differential transistors supply the first and second currents to the first and second current converters, respectively.

REFERNECE NUMERALS AND SYMBOLS AS SHOWN IN THE DRAWINGS

In the figures, 1 represents a differential current output circuit; 2, 3 represent current converters; 4 represents a voltage-adjustment circuit; Q1–Q24 represent npn transistors; R1–R19 represent resistors; SC1–SC19 represent constant current sinks; D1, D2 represent diodes; SV1 represents a constant voltage circuit; and T1–T15, T1'-T15' terminals.

DESCRIPTION OF THE EMBODIMENTS

First Embodiment

The first embodiment of the present invention will be explained with reference to FIG. 1.

Figure 1:
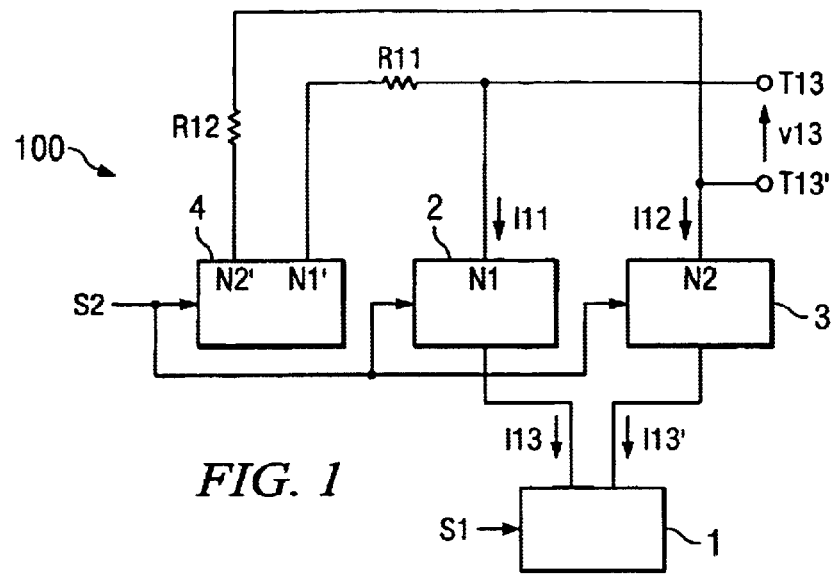
FIG. 1 is a schematic block diagram illustrating an example of the variable-gain amplifier disclosed in the first embodiment of the present invention.

FIG. 1 is a schematic block diagram illustrating an example of the variable-gain amplifier disclosed in the first embodiment of the present invention.

In FIG. 1, (1) represents a differential current output circuit. (2) and (3) represent current converters. (4) represents a voltage-adjustment circuit. R11 and R12 represent resistors. T13 and T13' represent terminals.

Differential current output circuit 1 outputs currents I13 and I13' as differential currents corresponding to input signal S1.

Current converter 2 converts current I13, which is output from differential current output circuit 1, into current I11 and outputs it from node N1 and also changes the current conversion gain corresponding to input signal S2.

Resistor R11 is connected between the output node N1 of current converter 2 and the output node N1' of voltage-adjustment circuit 4.

Resistor R12 is connected between the output node N2 of current converter 3 and the output node N2' of voltage-adjustment circuit 4.

Terminals T13 and T13' are connected to nodes N1 and N2, respectively.

Voltage-adjustment circuit 4 adjusts the voltages at nodes N1' and N2' in such a way that the voltages at nodes N1 and N2 are constant with respect to the change of input signal S2.

In variable-gain amplifier 100 shown in FIG. 1, which has the configuration, if current converters 2 and 3 have the same current conversion gain K and resistors R11 and R12 have the same resistance r11, the differential voltage v13 between terminals T13 and T13' can be expressed as follows.

$$V13 = K \times (I13' - I13) \times r11 \qquad (23)$$
$$= K \times Id1 \times r11$$

Id1 represents the differential current output from differential current output circuit 1.

In Equation (23), since differential current Id1 varies corresponding to input signal S1, differential voltage v13 changes corresponding to input signal S1. For example, if differential current Id1 is proportional to input signal S1, the gain of differential voltage v13 with respect to input signal S1 is proportional to (K×r11). Since the current converting gain changes corresponding to input signal S2, the gain of variable-gain amplifier 100 shown in FIG. 1 changes corresponding to input signal S2.

On the other hand, if the average of currents I13 and I13' with respect to the periodic change of input signal S1 is current I13a, the voltage drop Vr1 across resistors R11 and R12 caused by current I13a can be expressed as follows.

$$Vr1 = r11 \times K \times I13a \qquad (24)$$

As shown in Equation (24), since voltage drop Vr1 changes corresponding to current conversion gain K, if the voltages at nodes N1' and N2' are constant, the voltages at nodes N1 and N2 vary corresponding to input signal S2. On the other hand, in voltage-adjustment circuit 4, since the voltages at nodes N1' and N2' are adjusted in such a way that the changes in the voltages at nodes N1 and N2 caused by the voltage drops across resistors R1 and R2 cancel each other, in variable-gain amplifier 100 shown in FIG. 1, the in-phase voltages at terminals T13 and T13' can be held constant independently of the change in input signal S2.

The output nodes N1' and N2' of voltage-adjustment circuit 4 are not directly connected to terminals T13 and T13' but via resistors R11 and R12, respectively. Therefore, even if a capacitive component is present at the output nodes of voltage-adjustment circuit 4, the deterioration of the frequency characteristic caused by the capacitive component can be mitigated.

In the example shown in FIG. 1, the voltages at nodes N1' and N2' are adjusted with respect to the voltage drops across resistors R11 and R12, respectively. However, if the voltage drops across resistors R11 and R12 with respect to the change in input signal S2 are equal to each other as shown in Equation (24), it is also possible to connect nodes N1' and N2' to each other and adjust the voltage at the nodes.

Second Embodiment

In the following, the second embodiment will be explained with reference to FIGS. 2–4.

The configuration of the first embodiment is contained in the second embodiment.

Figure 2:
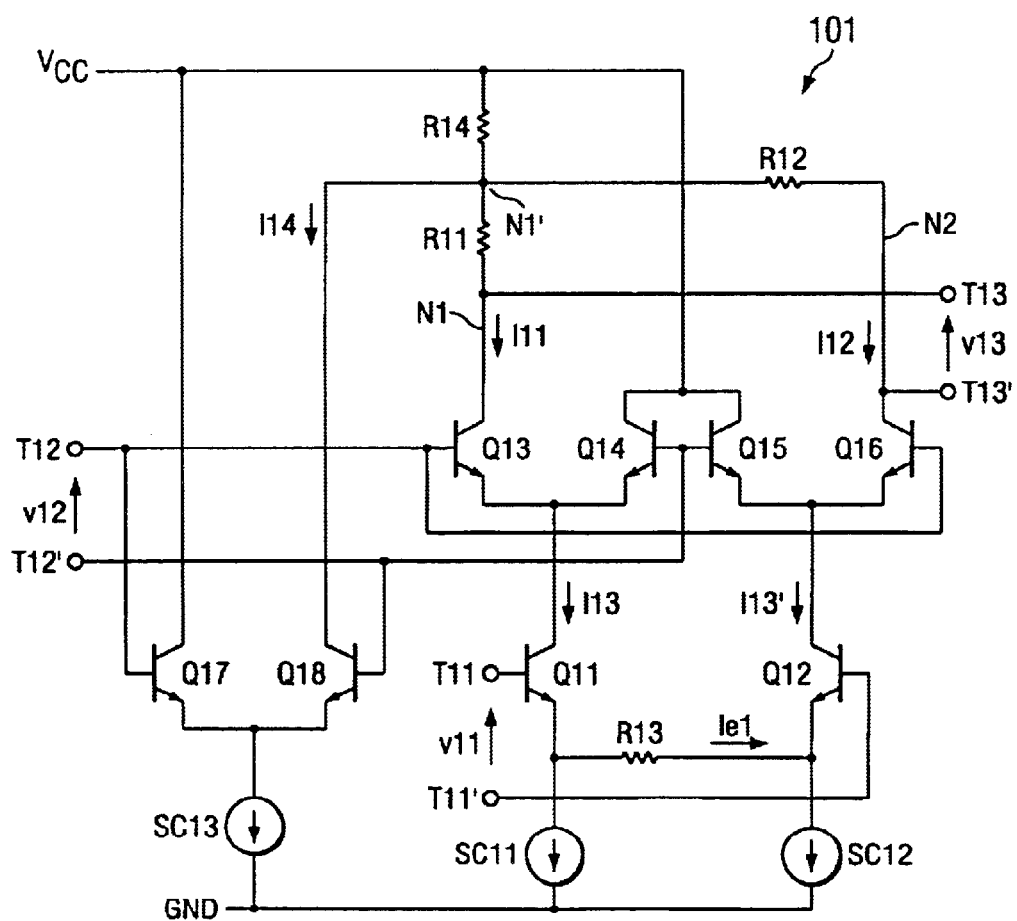
FIG. 2 is a schematic block diagram illustrating an example of the variable-gain amplifier disclosed in the second embodiment of the present invention.

FIG. 2 is a schematic diagram illustrating an example of the variable-gain amplifier disclosed in the second embodiment of the present invention.

In FIGS. 1 and 2, the same symbols represent the same parts, respectively. Also, in FIG. 2, Q11–Q18 represent npn transistors; R11–R14 represent resistors; SC11–SC13 represent constant current sinks; T11, T11', T12, T12', T13, T13' represent terminals.

The base of npn transistor Q11 is connected to terminal T11, and its emitter is connected to reference potential GND via constant current sink SC11.

The base of npn transistor Q12 is connected to terminal T11', and its emitter is connected to reference potential GND via constant current sink SC12.

Resistor R13 is connected between the emitters of npn transistor Q11 and npn transistor Q12.

The emitters of npn transistor Q13 and npn transistor Q14 are connected together and to the collector of npn transistor Q11. Also, the base of npn transistor Q13 is connected to terminal T12, and the base of npn transistor Q14 is connected to terminal T12'.

The emitters of npn transistor Q15 and npn transistor Q16 are connected together and to the collector of npn transistor Q12. Also, the base of npn transistor Q15 is connected to terminal T12', and the base of npn transistor Q16 is connected to terminal T12.

The collector of npn transistor Q13 is connected to terminal T13 and to the collector of npn transistor Q18 via resistor R11.

The collector of npn transistor Q16 is connected to terminal T13' and to the collector of npn transistor Q18 via resistor R12.

The collectors of npn transistor Q14 and npn transistor Q15 are both connected to power supply Vcc.

The emitters of npn transistor Q17 and npn transistor Q18 are connected together and to reference potential GND via constant current sink SC13. Also, the base of npn transistor Q17 is connected to terminal T12, and its collector is connected to power supply Vcc. The base of npn transistor Q18 is connected to terminal T12', and its collector is connected to power supply Vcc via resistor R14.

By using the variable-gain amplifier 101 shown in FIG. 2 with the configuration, the differential voltage v11 input between terminals T11 and T11' is amplified by a certain gain G11 and is output as differential voltage v13 from terminals T13 and T13'. The gain G11 is variable corresponding to differential voltage v2 input between terminals T12 and T12'.

First, the relationship between gain G11 and differential voltage v12 will be explained.

When the differential amplifier comprised of the transistor pair of npn transistor Q13 and npn transistor Q14 operates outside the saturation region, current I11 flowing through resistor R11 can be approximated as follows.

$$I11 = I13/\{1 + \exp(-v2/VT)\} \quad (25)$$
$$= I13 \times A(v12)$$

Current I12 flowing through resistor R12 can also be approximated with an equation similar to Equation (25).

$$I12 = I13' \times A(v12) \quad (26)$$

Also, when the same current Isc1 flows in constant current sinks SC11 and SC12, the collector current I13 of npn transistor Q11 and the collector current I13' of npn transistor Q12 can be approximated as follows.

$$I13 = Isc1 + Ie1 \quad (27)$$

$$I13' = Isc1 - Ie1 \quad (28)$$

Ie1 is the current flowing through resistor R13.

Also, differential voltage v11 can be expressed as follows using the base-emitter voltage Vbe11 of npn transistor Q11, the base-emitter voltage Vbe12 of npn transistor Q12, and resistance r13 of resistor R13.

$$V11 = Vbe11 + r12 \times Ie1 - Vbe12 \quad (29)$$

If resistors R11 and R12 have the same resistance r11, differential voltage v13 can be expressed as follows.

$$V13 = (I12 - I11) \times r11 \quad (30)$$

In this case, differential voltage v11 varies by as much as Δv11. If the voltage change of base-emitter voltage Vbe11 and base-emitter voltage Vbe12 is small compared with voltage Δv11, voltage Δv11 is expressed as follows.

$$\Delta v11 = r13 \times \Delta Ie1 \quad (31)$$

ΔIe1 represents the change in current Ie1 corresponding to the change of voltage Δv11.

Also, the change ΔI13 in current I13 and the change ΔI13' in current I13' are expressed by the following equations.

$$\Delta I13 = \Delta Ie1 \quad (32)$$
$$= \Delta v11/r13$$

$$\Delta I13' = \Delta Ie1 \quad (33)$$
$$= -\Delta v11/r13$$

Based on Equations (32) and (33), the change ΔI11 in current I11 and the change ΔI12 in current I12 can be expressed as follows.

$$\Delta I11 = \Delta I13 \times A(v12) \quad (34)$$
$$= \Delta v11 \times A(v12)/r13$$

$$\Delta I12 = \Delta I13' \times A(v12) \quad (35)$$
$$= -\Delta v11 \times A(v12)/r13$$

Based on Equations (30), (33), and (34), the change $\Delta v13$ in differential voltage v13 can be expressed as follows.

$$\Delta v13 = (\Delta I11 - \Delta I12) \times r11 \quad (36)$$
$$= -2\Delta v11 \times A(v12) \times r11/r13$$
$$= G11 \times \Delta v11$$

where $$G11 = -2A(v12) \times r11/r13 \quad (37)$$

Consequently, as shown in Equation 37, the gain G11 of variable-gain amplifier 101 shown in FIG. 2 can be changed corresponding to differential voltage v12.

The collector current I14 of npn transistor Q18 can be approximated with the following equation in the same way as currents I11 and I12.

$$I14 = Isc3/\{1 + \exp(v12/VT)\} \quad (38)$$
$$= Isc3 \times A'(v12)$$

Isc3 represents the current of constant current sink SC13.

Consequently, the voltage drop Vn1' at node N1' with respect to power supply Vcc can be expressed as follows.

$$Vn1' = (I14 - I11 + I12) \times r14 \quad (39)$$
$$= \{Isc3 \times A'(v12) + 2Isc1 \times A(v12)\} \times r14 \quad (40)$$

r14 is the resistance of resistor R14.

Based on Equations (25), (27), and (40), the voltage drop Vn1 at node N1 with respect to power supply Vcc can be expressed as follows.

$$Vn1 = Vn1' + I11 \times r11 \quad (41)$$
$$= Vn1' + (Isc1 + Ie1) \times A(v12) \times r11$$
$$= B \times A'(v12) + C \times A(v12) + Ie1 \times A(v12) \times r11$$

where $$B = r14 \times Isc3 \quad (42)$$
$$C = (2 \times r14 + r11) \times Isc1 \quad (43)$$

Based on Equations (26), (28), and (40), the voltage drop Vn2 at node N2 with respect to power supply Vcc can be expressed as follows.

$$Vn2 = Vn1' + I12 \times r11 \quad (44)$$
$$= Vn1' + (Isc1 + Ie1) \times A(v12) \times r11$$
$$= B \times A'(v12) + C \times A(v12) - Ie1 \times A(v12) \times r11$$

In Equations (41) and (44), the third term is a signal component including current Ie1 that varies corresponding to the change in differential voltage v11. The first and second terms represent constant in-phase component V11c independent of the change in differential voltage v11.

If B=C in the first and second terms, the in-phase component V11c can be expressed as follows.

$$V11c = B \times \{A'(v12) + A(v12)\} \quad (45)$$
$$= B$$

As can be seen from Equation (45), in-phase component V11c is a constant that is independent of differential voltage v12.

Also, in this case, the following relationship can be obtained if B=C.

$$Isc3 \times r14 = (2 \times r14 + r11) \times Isc1$$
$$Isc3 = (2 + r11/r14) \times Isc1 \quad (46)$$
$$Ifr14 = a \times r11,$$
$$Isc3 = \{(2a+1)/a\} \times Isc1 \quad (46)'$$

Consequently, when current Isc1, current Isc3, resistance r11, and resistance r14 are chosen appropriately to satisfy the relationship of Equation (46) or (46)', the change in in-phase component V11c that accompanies with the change in differential voltage v12 can be restricted.

In the following, a simulation example of variable-gain amplifier 101 shown in FIG. 2 will be explained.

Figure 3:
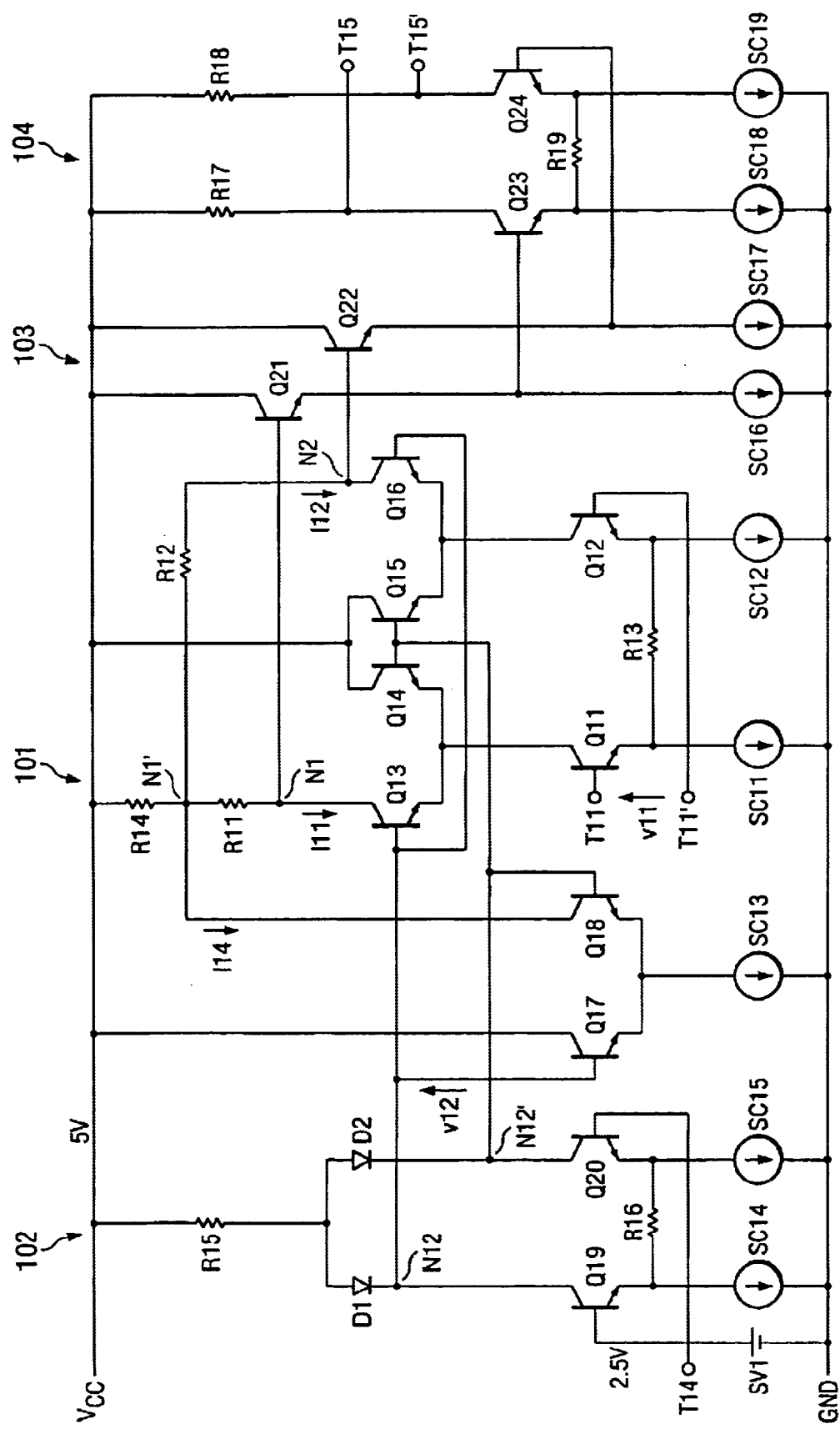
FIG. 3 is a circuit diagram explaining a simulation example of the variable-gain amplifier shown in FIG. 2.

FIG. 3 is a diagram illustrating the simulation circuit. Differential amplifier 102 is in the first stage of variable-gain amplifier 101 shown in FIG. 2. Emitter follower circuit 103 is in the next stage. Differential amplifier 104 is in the final stage.

In FIGS. 2 and 3, the same symbols represent the same elements, respectively. In FIG. 3, Q19–Q24 represent npn transistors; R15–R19 represent resistors; SC14–SC19 represent constant current sinks. D1 and D2 represent diodes. SV1 represents a constant voltage circuit. T14, T15, and T15' represent terminals.

The differential amplifier 102 in the first stage comprises npn transistor Q19, npn transistor Q20, resistor R16, constant current sink SC14, constant current sink SC15, diode D1, diode D2, and resistor R15.

The emitters of npn transistor Q19 and npn transistor Q20 are connected to each other via resistor R16 and to reference potential GND via constant current sink SC14 and constant current sink SC15, respectively. The collector of npn transistor Q19 is connected to node N12, and a voltage (2.5 V) is supplied to its base from constant voltage circuit SV1. The collector of npn transistor Q20 is connected to node N12', and its base is connected to terminal T14.

Anode terminals of diodes D1 and D2 are connected to the voltage source Vcc (5V) via resistor R15. The cathode terminal of diode D1 is connected to node N12, and the cathode terminal of diode D2 is connected to node N12'. Nodes N12 and N12' respectively correspond to terminals T12 and T12' in FIG. 2.

The emitter follower circuit 103 in the next stage comprises npn transistor Q21, npn transistor Q22, constant current sink SC16 and constant current sink SC17.

The base of npn transistor Q21 is connected to node N1, its collector is connected to power supply Vcc, and its emitter is connected to reference potential GND via constant current sink SC16. The base of npn transistor Q22 is connected to node N2, its collector is connected to power supply Vcc, and its emitter is connected to reference potential GND via constant current sink SC17.

The differential amplifier 104 in the stage next to emitter follower 103 comprises npn transistor Q23, npn transistor Q24, constant current sink SC18, constant current sink SC19, and resistors R17–R19.

The emitters of npn transistor Q23 and npn transistor Q24 are connected to each other via resistor R19 and to reference potential GND via constant current sinks SC18 and SC19, respectively. The collector of npn transistor Q23 is connected to power supply Vcc via resistor R17, and its base is connected to the emitter of npn transistor Q21. The collector of npn transistor Q24 is connected to power supply Vcc via resistor R18, and its base is connected to the emitter of npn transistor Q22.

The resistance r11 of resistors R11 and R12 in variable-gain amplifier 101 is set to 1 kΩ, the resistance r14 of resistor R14 is set to 500 Ω, and the current Isc1 of constant current sinks SC11 and SC12 is set to 500 μA. Also, the current Isc3 of constant current sink SC13 is set to 2 mA to satisfy Equation (46).

Figure 4:
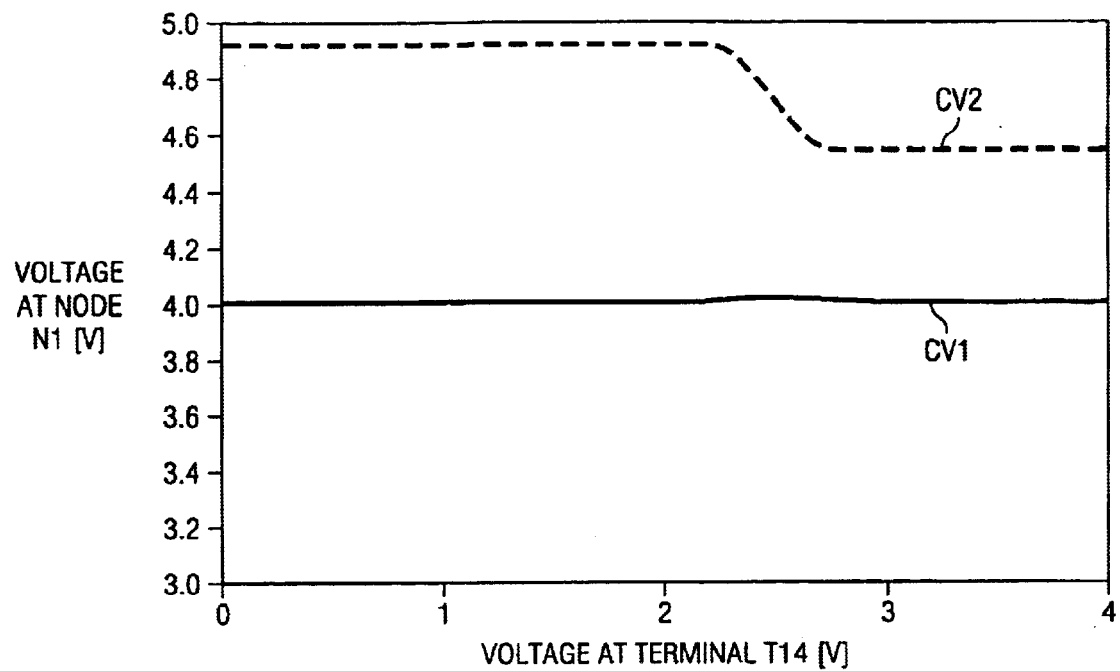
FIG. 4 is a diagram illustrating the relationship between the voltage at the input terminal and the output node voltage of the variable-gain amplifier in the simulation circuit shown in FIG. 3.

FIG. 4 is a diagram illustrating the relationship between the voltage supplied to terminal T14 and the voltage at node N1 in the simulation circuit shown in FIG. 3.

Figure 5:
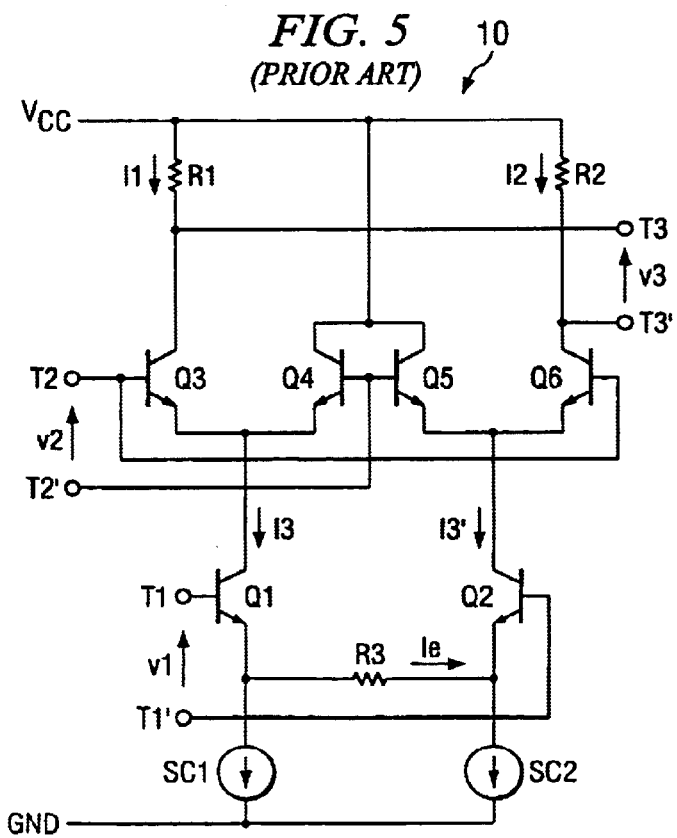
FIG. 5 is a schematic circuit diagram illustrating an example of a conventional variable-gain amplifier.
Figure 6:
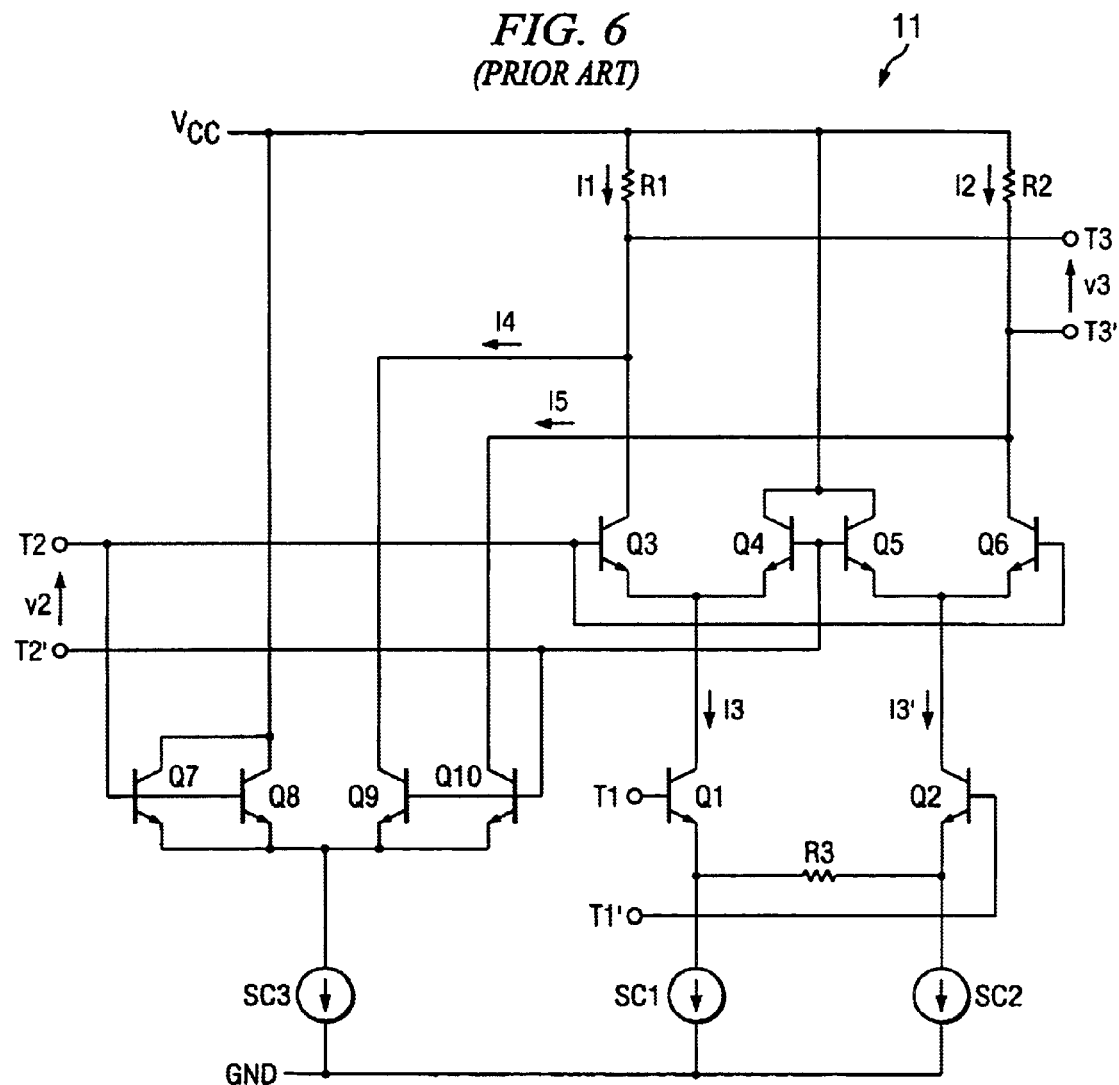
FIG. 6 is a schematic circuit diagram illustrating an example of a conventional variable-gain amplifier that can suppress the change in the output in-phase voltage caused by the change in the gain.

In FIG. 4, curve CV1 shows the simulation results realized by the simulation circuit shown in FIG. 3. Curve CV2 shows the simulation results in the case when variable-gain amplifier 101 in the simulation circuit shown in FIG. 3 is replaced with the conventional variable-gain amplifier 10 shown in FIG. 5.

When the voltage at terminal T14 is around 2.5 V, differential amplifier 102 operates outside the saturation region. The gain of variable-gain amplifier 101 in that voltage range varies corresponding to the voltage at terminal T14. As can be seen from the simulation results shown in FIG. 4, the voltage at node N1 also changes by about 0.4 V along with the change in the gain in the conventional variable-gain amplifier 10. Also, the voltage of the variable-gain amplifier 101 disclosed in the present embodiment is held approximately constant.

As explained above, by using the variable-gain amplifier 101 shown in FIG. 2, the collector current I14 of npn transistor Q18 is changed corresponding to differential voltage v12 to change the voltage at node N1' such that the in-phase voltage at nodes N1 and N2 where differential voltage v13 is output is held constant. Consequently, the change in the in-phase voltage at the output caused by the change in the gain can be suppressed.

Also, since the collector of npn transistor Q18 is connected to nodes N1 and N2 via resistors, the deterioration of the frequency characteristic caused by the capacitance of the collector can be alleviated.

The present invention is not limited to the embodiments. Various modifications that are self-clear to the expert in the field are possible.

For example, npn transistors are mainly used in the embodiments. The present invention can also be realized by using pnp transistors or other transistors (MOS transistors, etc.).

The emitters of npn transistor Q13 and npn transistor Q14 in variable-gain amplifier 101 or the emitters of npn transistor Q15 and npn transistor Q16 can be either directly connected as shown in FIG. 2 or connected via resistors. In this way, the input range of differential voltage v12 for the transistor pairs to operate outside the saturation region can be expanded.

In these embodiments, it is also possible to replace the constant current sinks SC with resistors having appropriate resistance values.

By using the variable-gain amplifier disclosed in the present invention, the change in the in-phase voltage at the output caused by the change in the gain can be prevented, and the frequency characteristic can be improved.

What is claimed is:

1. A variable-gain amplifier comprising:

a differential current output circuit that outputs a first current and a second current as differential currents corresponding to a first input signal, a first current converter that converts the first current into a third current at a current conversion rate corresponding to a second input signal and outputs the third current to a first node, a second current converter that converts the second current into a fourth current at a current conversion rate corresponding to the second input signal and outputs the fourth current to a second node, a first load resistor connected between the first node and a third node, a second load resistor connected between the second and third nodes, and a voltage-adjustment circuit that acts as an adjustable resistor between the voltage supply terminal and the third node wherein the voltage-adjustment circuit has a pair of differential transistors to which the second input signal is supplied as a differential signal, where one of the transistors supplies a current corresponding to the second input signal to the third node such that the voltages at the first and second nodes do not change as the second signal varies.

2. The variable-gain amplifier of claim 1, wherein the first current converter has a pair of differential transistors to which the second input signal is supplied as a differential signal, where one of the transistors supplies the third current to the first node;

the second current converter has a pair of differential transistors to which the second input signal is supplied as a differential signal, where one of the transistors supplies the fourth current to the second node.

3. The variable-gain amplifier of claim 2, wherein the differential output circuit has a pair of differential transistors to which the first input signal is supplied as a differential signal, and a resistor connected between the differential transistor pair, where the differential transistors supply the first and second currents to the first and second current converters, respectively.

4. The variable-gain amplifier of claim 1, wherein the first current converter has a pair of differential transistors to which the second input signal is supplied as a differential signal, where one of the transistors supplies the third current to the first node;

the second current converter has a pair of differential transistors to which the second input signal is supplied as a differential signal, where one of the transistors supplies the fourth current to the second node.

5. The variable-gain amplifier of claim 4, the differential output circuit has a pair of differential transistors to which the first input signal is supplied as a differential signal, and a resistor connected between the differential transistor pair, where the differential transistors supply the first and second currents to the first and second current converters, respectively.

* * * * *